United States Patent
Kimoto et al.

(10) Patent No.: US 10,950,558 B2
(45) Date of Patent: Mar. 16, 2021

(54) SEMICONDUCTOR DEVICE, POWER CONVERTER, AND METHOD FOR MANUFACTURING SEMICONDUCTOR DEVICE

(71) Applicant: Mitsubishi Electric Corporation, Tokyo (JP)

(72) Inventors: Nobuyoshi Kimoto, Fukuoka (JP); Mitsunori Aiko, Tokyo (JP); Takaaki Shirasawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/475,935

(22) PCT Filed: Mar. 27, 2017

(86) PCT No.: PCT/JP2017/012229
§ 371 (c)(1),
(2) Date: Jul. 3, 2019

(87) PCT Pub. No.: WO2018/179023
PCT Pub. Date: Oct. 4, 2018

(65) Prior Publication Data
US 2020/0013730 A1    Jan. 9, 2020

(51) Int. Cl.
*H01L 23/00* (2006.01)
*H01L 21/48* (2006.01)
(Continued)

(52) U.S. Cl.
CPC ........ *H01L 23/562* (2013.01); *H01L 21/4825* (2013.01); *H01L 23/4951* (2013.01);
(Continued)

(58) Field of Classification Search
CPC ....... H01L 21/4825; H01L 2224/26145; H01L 23/562; H01L 23/4951; H01L 23/49562; H01L 23/49568; H01L 23/48; H01L 23/50
See application file for complete search history.

(56) References Cited

U.S. PATENT DOCUMENTS

2008/0251940 A1    10/2008  Lee et al.
2013/0307130 A1*   11/2013  Oga ................. H01L 24/97
                                                 257/666
(Continued)

FOREIGN PATENT DOCUMENTS

JP   H07-030242 A   1/1995
JP   2007-013219 A  1/2007
JP   2016-086069 A  5/2016

OTHER PUBLICATIONS

An Office Action issued by the Japanese Patent Office dated Oct. 1, 2019, which corresponds to Japanese Patent Application No. 2019-508326 and is related to U.S. Appl. No. 16/475,935.
(Continued)

*Primary Examiner* — Herve-Louis Y Assouman
(74) *Attorney, Agent, or Firm* — Studebaker & Brackett PC

(57) ABSTRACT

An object is to provide a technique for reducing process steps, and a stress generated at the peripheral portion of the joint portion between an electrode of a semiconductor element and a lead frame. A semiconductor device includes the following: a semiconductor element disposed on a heat spreader; a lead frame joined to an emitter electrode of the semiconductor element via solder, which is a joining material; a metal film disposed on a surface of the emitter electrode; and an anti-oxidation film disposed on a surface
(Continued)

of the metal film. The metal film has a peripheral portion that is entirely exposed from the anti-oxidation film.

15 Claims, 9 Drawing Sheets

(51) Int. Cl.
    *H01L 23/495* (2006.01)
    *H02M 7/44* (2006.01)
(52) U.S. Cl.
    CPC .. *H01L 23/49562* (2013.01); *H01L 23/49568* (2013.01); *H02M 7/44* (2013.01)

(56) References Cited

U.S. PATENT DOCUMENTS

| | | | | |
|---|---|---|---|---|
| 2015/0235925 A1* | 8/2015 | Nakata | ............. | H01L 24/16 257/762 |
| 2016/0005703 A1* | 1/2016 | Nakata | ............. | H01L 24/32 257/779 |

OTHER PUBLICATIONS

International Search Report issued in PCT/JP2017/012229; dated Jun. 6, 2017.

\* cited by examiner

F I G. 1
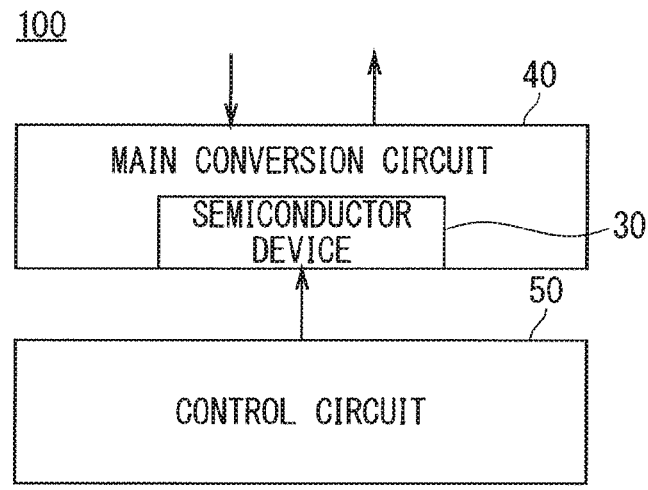
F I G. 2
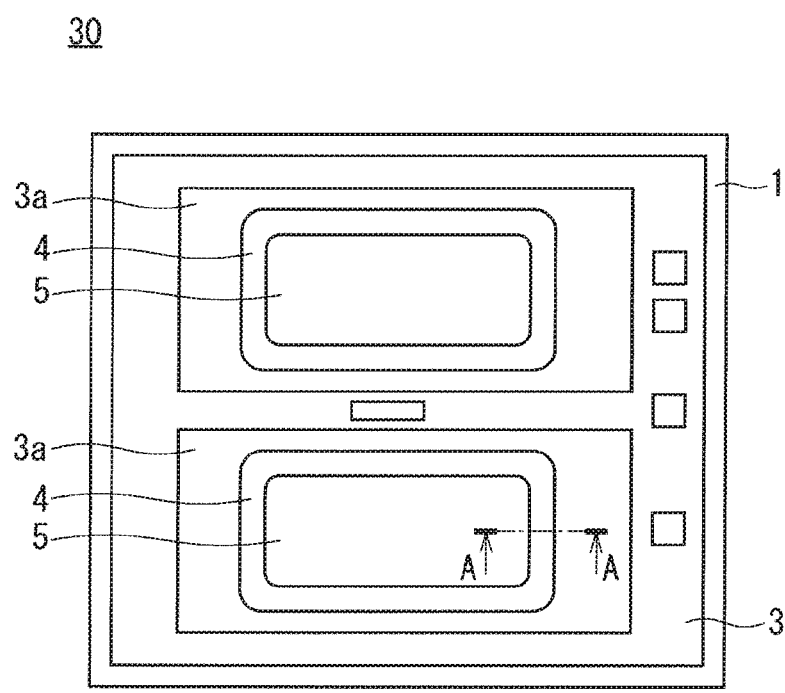

SEMICONDUCTOR DEVICE, POWER CONVERTER, AND METHOD FOR MANUFACTURING SEMICONDUCTOR DEVICE

TECHNICAL FIELD

The present invention relates to a structure in which a semiconductor element disposed on a semiconductor device for power control is joined to a lead frame, for instance.

BACKGROUND ART

A semiconductor device under repeated thermal stress exhibits stress concentration at the peripheral portion of the joint portion between an emitter electrode of a semiconductor element disposed on the semiconductor device, and a lead frame, Such stress concentration damages the emitter electrode. To reduce the stress at the peripheral portion of the joint portion, a coating film has been conventionally formed over the joint portion.

Patent Document 1 discloses a thin-film circuit substrate that includes a first metal coating film disposed on a substrate and being highly oxidative, a second metal coating film selectively disposed on the first metal coating film and being highly resistant to oxidation, and an oxidized coating film formed by oxidizing the exposed portions of the first metal coating film.

PRIOR ART DOCUMENT

Patent Document

Patent Document 1: Japanese Patent Application Laid-Open No. 7-30242

SUMMARY

Problem to be Solved by the Invention

Unfortunately, to form the coating film over the joint portion between the emitter electrode and the lead frame, required is a changeover to an apparatus that is different from an apparatus for forming a metal film that is formed on a surface of the emitter electrode. In addition, foreign matters can adhere during transfer between process steps. Furthermore, the coating film after formed needs to undergo inspections on position, dimension, thin spots, and other things. Such inspections increase process steps.

As with the technique in Patent Document 1, partly removing the thickness of an anti-oxidation film, serving as a solder mask, is a conventionally proposed technique. This technique includes, however, removing part of the anti-oxidation film between adjacent electronic components, and thus fails to reduce the stress generated at the joint portion between the emitter electrode and the lead frame.

It is an object of the present invention to provide a technique for reducing process steps, and a stress generated at the peripheral portion of the joint portion between an electrode of a semiconductor element, and a lead frame.

Means to Solve the Problem

A semiconductor device according to the present invention includes the following: a semiconductor element disposed on a heat spreader; a lead frame joined to an electrode of the semiconductor element via a joining material; a metal film disposed on a surface of the electrode; and an anti-oxidation film disposed on a surface of the metal film. The metal film has a peripheral portion that is entirely exposed from the anti-oxidation film.

Effects of the Invention

The semiconductor device according to the present invention includes the following: the semiconductor element disposed on the heat spreader; the lead frame joined to the electrode of the semiconductor element via the joining material; the metal film disposed on the surface of the electrode; and the anti-oxidation film disposed on the surface of the metal film. The entire peripheral portion of the metal film is exposed from the anti-oxidation film.

The semiconductor device prevents the joining material from flowing and spreading, thereby preventing degradation in the strength of the joint between the electrode and the lead frame. As a result, the electrode of the semiconductor element receives a reduced stress at the peripheral portion of the joint portion between the emitter electrode and the lead frame.

In addition, a process step of forming a coating film, which has been conventionally performed, is no longer needed, thereby lowering the possibility that foreign matters can adhere during transfer between process steps. This eliminates the need for inspections, for instance, on the position and dimension of the coating film after formation, and on thin spots in the coating film, thereby reducing process steps.

These and other objects, features, aspects and advantages of the present invention will become more apparent from the following detailed description of the present invention when taken in conjunction with the accompanying drawings.

BRIEF DESCRIPTION OF DRAWINGS

FIG. 1 is a schematic diagram illustrating the configuration of a power converter according to a first embodiment.

FIG. 2 is a plan view illustrating a semiconductor device according to the first embodiment before joining to a lead frame.

DESCRIPTION OF EMBODIMENT(S)

First Embodiment

The following describes a first embodiment of the present invention with reference to the drawings. FIG. 1 is a schematic diagram illustrating the configuration of a power converter 100 according to the first embodiment.

First, the power converter 100 according to the first embodiment will be briefly described. The power converter 100 is a power conditioner connected, for instance, between a DC power supply and a power system. This power conditioner converts DC power sent from a photovoltaic cell, a fuel cell, or other things, into AC power, and supplies the AC power to the outside, such as the power system. The power converter 100 includes a main conversion circuit 40 and a control circuit 50. The main conversion circuit 40 includes a semiconductor device 30. The main conversion circuit 40 converts power received from the outside, and outputs the power. The control circuit 50 outputs a control signal for controlling the main conversion circuit 40, to the main conversion circuit 40.

Figure 3:
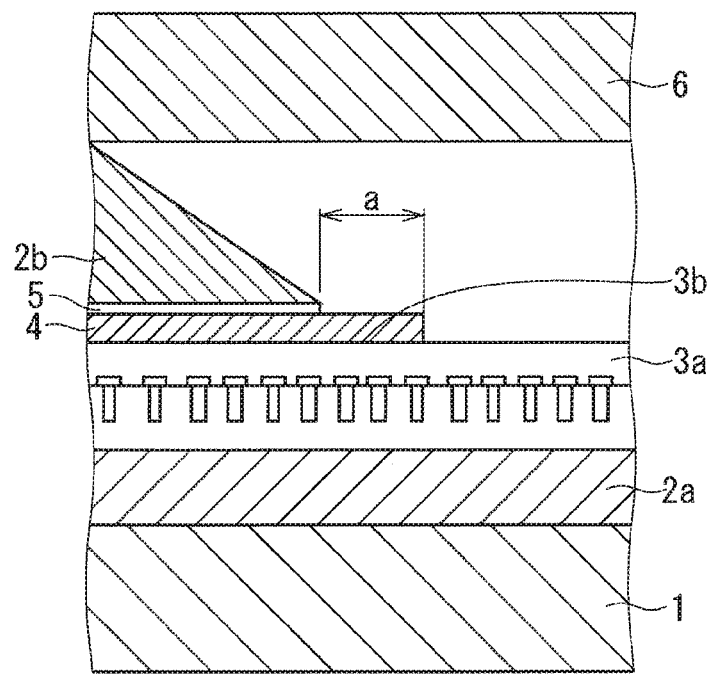
FIG. 3 is a cross-sectional view taken along line A-A in FIG. 2.

Next, the semiconductor device 30 according to the first embodiment will be described. FIG. 2 is a plan view illustrating the semiconductor device 30 according to the first embodiment before joining to a lead frame 6. FIG. 3 is a cross-sectional view taken along line A-A in FIG. 2.

As illustrated in FIGS. 2 and 3, the semiconductor device 30 includes a heat spreader 1, a semiconductor element 3, a metal film 4, an anti-oxidation film 5, and the lead frame 6. The semiconductor element 3 is joined to a surface of the heat spreader 1 via solder 2a, which is a joining material, and is thus disposed on the heat spreader 1. The lead frame 6 is joined to an emitter electrode 3a of the semiconductor element 3 via solder 2b, which is a joining material. To be more specific, the lead frame 6 is joined to a surface of the anti-oxidation film 5 disposed on a surface of the emitter electrode 3a.

Next, the metal film 4 and the anti-oxidation film 5, both disposed on the surface of the emitter electrode 3a, will be described. The metal film 4 is disposed on a surface of a joint portion 3b of the emitter electrode 3a. The anti-oxidation film 5 is disposed in a region except the peripheral portion of a surface of the metal film 4. The peripheral portion of the metal film 4 is thus entirely exposed from the anti-oxidation film 5; in addition, the solder 2b flows across a region of the anti-oxidation film 5 located closer to the middle of the joint portion 3b of the emitter electrode 3a than the metal film 4. Here, a width a, indicating how much the peripheral portion of the metal film 4 is exposed from the anti-oxidation film 5, is uniform throughout the peripheral portion of the metal film 4.

Figure 4:
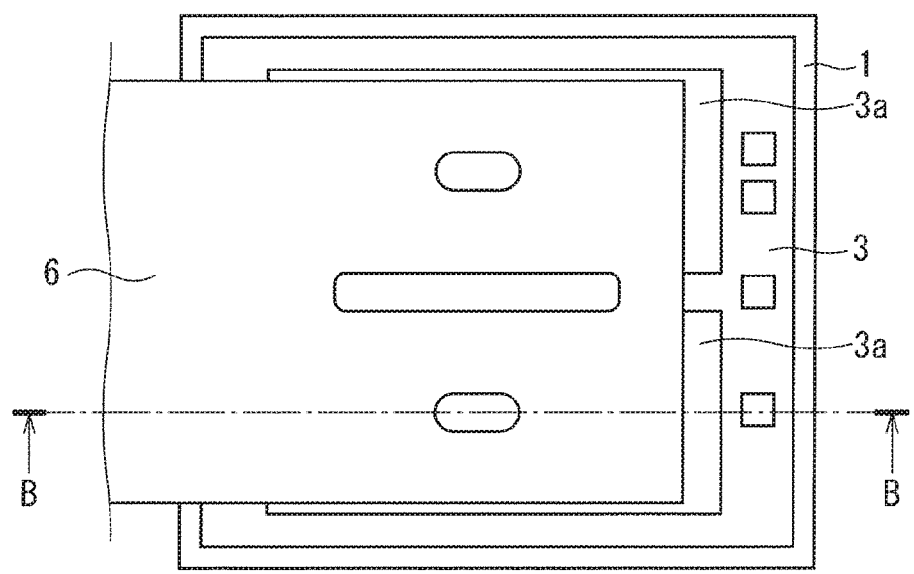
FIG. 4 is a plan view illustrating the semiconductor device according to the first embodiment.
Figure 5:
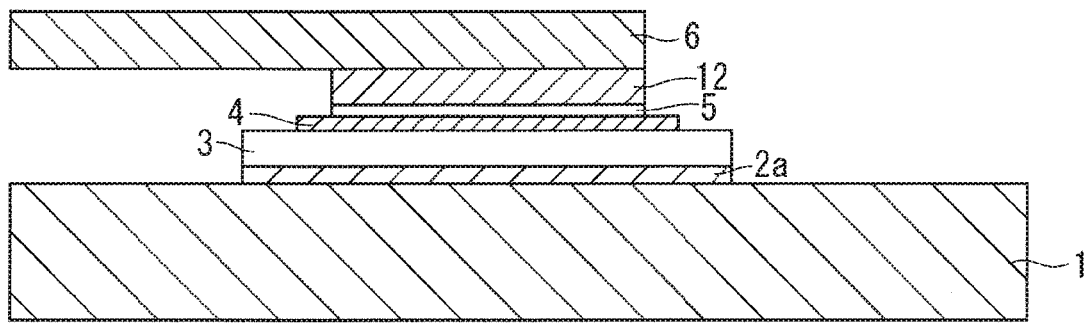
FIG. 5 is a cross-sectional view taken along line B-B in FIG. 4.

Next, a method for manufacturing the semiconductor device 30 will be described. FIG. 4 is a plan view illustrating the semiconductor device 30 according to the first embodiment. FIG. 5 is a cross-sectional view taken along line B-B in FIG. 4.

The semiconductor element 3 is mounted onto the surface of the heat spreader 1 by joining the semiconductor element 3 to the surface via the solder 2a. Then, the metal film 4 is formed onto the joint portion 3b of the emitter electrode 3a of the semiconductor element 3, through sputtering, vapor deposition, or plating. The anti-oxidation film 5 is formed onto a region except the entire peripheral portion of the surface of the metal film 4, through sputtering using, for instance, a stainless steel mask, or through vapor deposition or plating.

The emitter electrode 3a is made of Al and other materials. The films on the surface of the emitter electrode 3a are made of Ni, Au and other materials that are, in this order, stacked on the semiconductor element 3. The metal film 4 is made of Ni and other materials, and the anti-oxidation film 5 is made of Au and other materials. The anti-oxidation film 5 is provided for preventing poor solder wettability resulting from the oxidation of the Ni metal film 4.

Referring to the thickness of the stacked films on the surface of the emitter electrode 3a, a relationship of the metal film 4>the anti-oxidation film 5 is satisfied. To be specific, the metal film 4 has a thickness of 0.5 µm or greater and 5 µm or less, and the anti-oxidation film 5 has a thickness of 0.05 µm or greater and 0.2 µm or less. The width a, indicating how much the peripheral portion of the metal film 4 is exposed from the anti-oxidation film 5, is 50 µm or greater and 500 µm or less. The thicker the metal film 4 is, and the greater the width a is, which indicates how much the peripheral portion of the metal film 4 is exposed from the anti-oxidation film 5, the less the solder flows and spreads, thus preventing degradation in the strength of the joint portion 3b. Consequently, the joint portion 3b receives a reduced stress generated at its peripheral portion.

Subsequently, as illustrated in FIGS. 4 and 5, a solder plate 12 is used as a joining material. The solder plate 12 is placed onto the surface of the anti-oxidation film 5, and the lead frame 6 is joined to the emitter electrode 3a via the solder plate 12. At this stage, the dimension of the solder plate 12 in plan view is the same as the dimension of the anti-oxidation film. 5 in plan view. This forms a solder fillet on the surface of the semiconductor element 3. Changing the size of the solder plate 12 regulates a region for the solder to flow, and regulates the volume of the solder. This improves the assembly performance of the semiconductor device 30.

Figure 6:
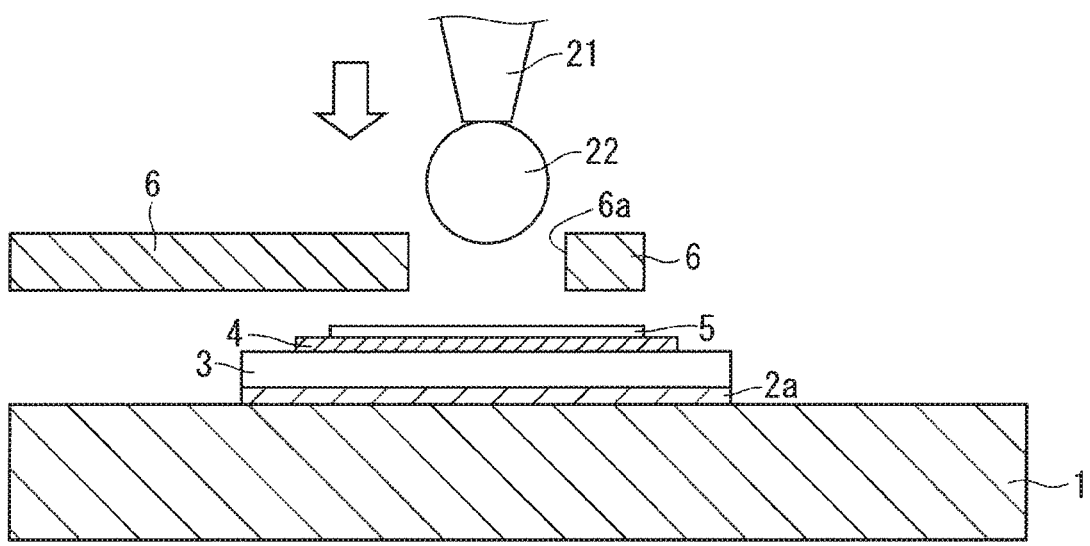
FIG. 6 is a diagram for describing a process step of joining the semiconductor device according to the first embodiment using molten solder.
Figure 7:
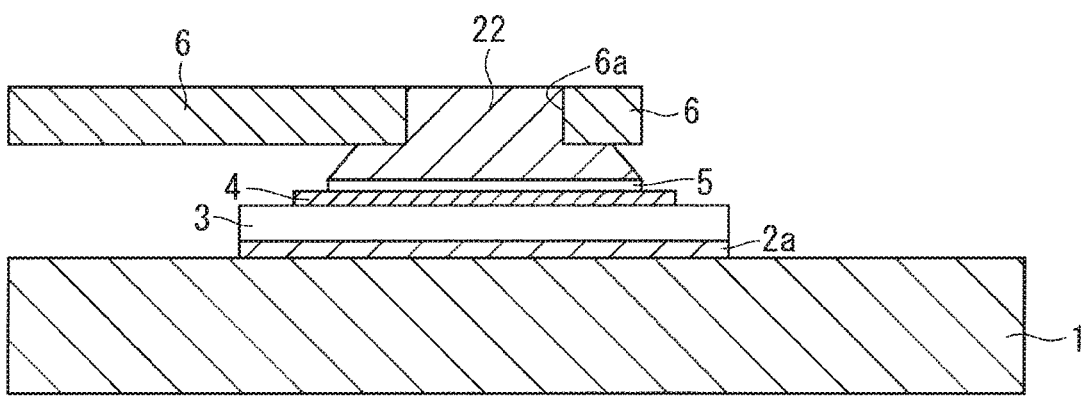
FIG. 7 is a diagram for describing a process step of joining the semiconductor device according to the first embodiment using the molten solder.

Alternatively, as illustrated in FIGS. 6 and 7, molten solder 22 can be used a joining material. The molten solder 22 can be put onto the surface of the anti-oxidation film 5 from a nozzle 21 via a hole portion 6a of the lead frame 6, and the lead frame 6 can be joined to the emitter electrode 3a via the molten solder 22. At this stage, the molten solder 22 flows and spreads, thus forming a solder fillet on the surface of the semiconductor element 3. The flow and spread of the molten solder 22 regulates the region for the solder to flow d spread. This improves the assembly performance of the semiconductor device 30.

As described above, the semiconductor device 30 according to the first embodiment includes the following: the semiconductor element 3 disposed on the heat spreader 1; the lead frame 6 joined to the emitter electrode 3a of the semiconductor element 3 via the solder 2b; the metal film 4 disposed on the surface of the emitter electrode 3a; and the anti-oxidation film 5 disposed on the surface of the metal film 4. The entire peripheral portion of the metal film 4 is exposed from the anti-oxidation film 5.

The semiconductor device 30 consequently prevents the solder 2b from flowing and spreading, thereby preventing the degradation in the strength of the joint between the emitter electrode 3a and the lead frame 6. As a result, the emitter electrode 3a of the semiconductor element 3 receives a reduced stress at the peripheral portion of the joint portion 3b, which is the joint between the emitter electrode 3a and the lead frame 6.

Doing so prevents cracking in the electrode on the surface; such cracking results from the emitter electrode 3a as buckled or peeled off by deformation in the metal film 4 under stress due to heat cycles.

Doing so also eliminates the need for a process step of forming a coating film, which has been conventionally performed, thereby lowering the possibility that foreign matters can adhere during transfer between process steps. This eliminates the need for inspections, for instance, on the position and dimension of the coating film after formation, and on thin spots in the coating film, thereby reducing process steps.

The peripheral portion of the metal film 4, which is exposed from the anti-oxidation film 5, is rendered left in the air at room temperature. Accordingly, formed at the peripheral portion of the metal film 4 is a native oxide film. This eliminates the need for covering the outer periphery portion of a surface of a conventional anti-oxidation film, thereby reducing process steps and components.

The power converter 100 includes the main conversion circuit 40 having the semiconductor device 30. The conversion circuit 40 converts and then outputs the received power. The power converter 100 also includes the control circuit 50 that outputs the control signal for controlling the main conversion circuit 40, to the main conversion circuit 40. The power converter 100 is consequently highly reliable, and has high quality.

The method for manufacturing the semiconductor device 30 includes the following: using the solder plate 12 as the joining material; placing the solder plate 12 onto the surface of the anti-oxidation film 5; and joining the lead frame 6 to the emitter electrode 3a using the solder plate 12.

The dimension of the solder plate 12 in plan view is the same as the dimension of the anti-oxidation film 5 in plan view. This forms a solder fillet on the surface of the semiconductor element 3. In addition, changing the size of the solder plate 12 regulates the region for the solder to flow, and regulates the volume of the solder. This improves the assembly performance of the semiconductor device 30.

The method for manufacturing the semiconductor device 30 includes the following: using the molten solder 22 as the joining material; putting the molten solder 22 onto the surface of the anti-oxidation film 5; and joining the lead frame 6 to the emitter electrode 3a via the molten solder 22.

Accordingly, the molten solder 22 flows and spreads, thus forming a solder fillet on the surface of the semiconductor element 3. The flow and spread of the molten solder 22 regulates the region for the solder to flow. This improves the assembly performance of the semiconductor device 30.

Second Embodiment

Figure 8:
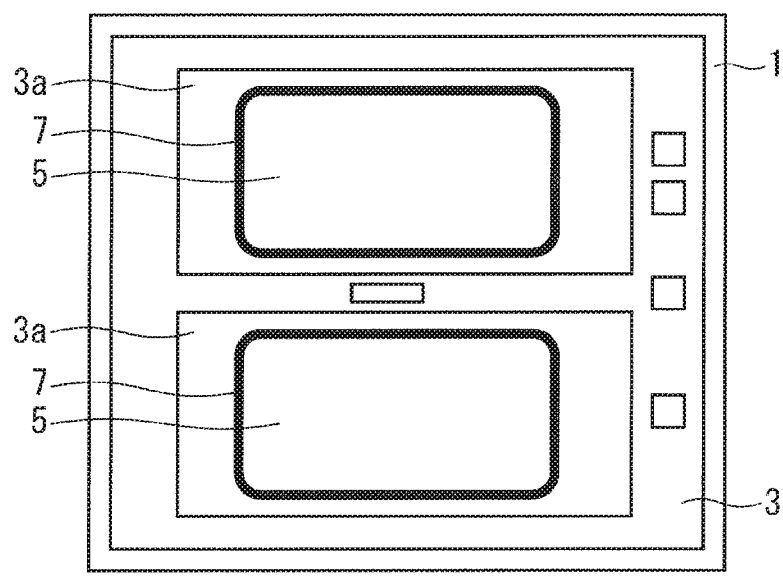
FIG. 8 is a plan view illustrating a semiconductor device according to a second embodiment before joining to the lead frame.
Figure 9:
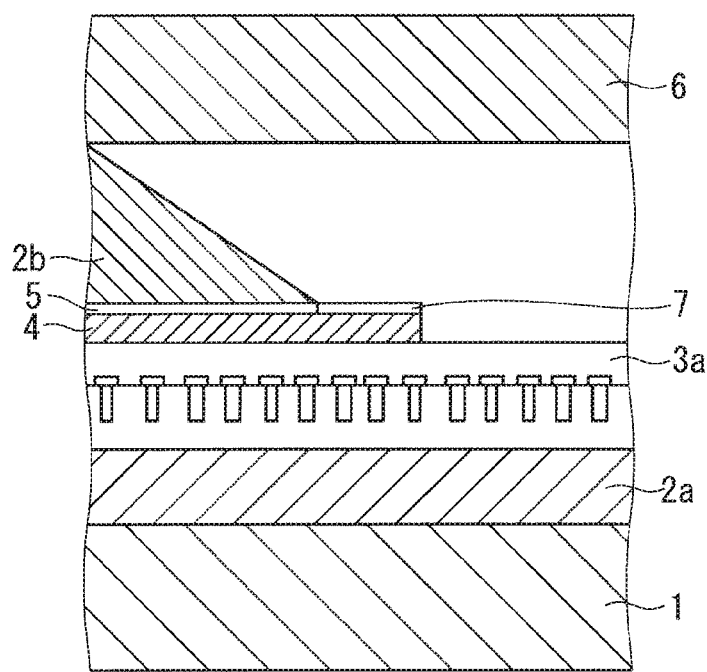
FIG. 9 is a cross-sectional view of the semiconductor device according to the second embodiment, and corresponds to FIG. 3.
Figure 10:
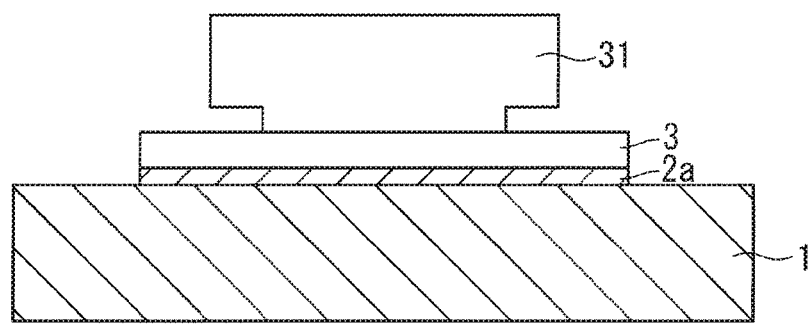
FIG. 10 is a diagram for describing a process step of oxidizing a metal film of the semiconductor device according to the second embodiment.
Figure 11:
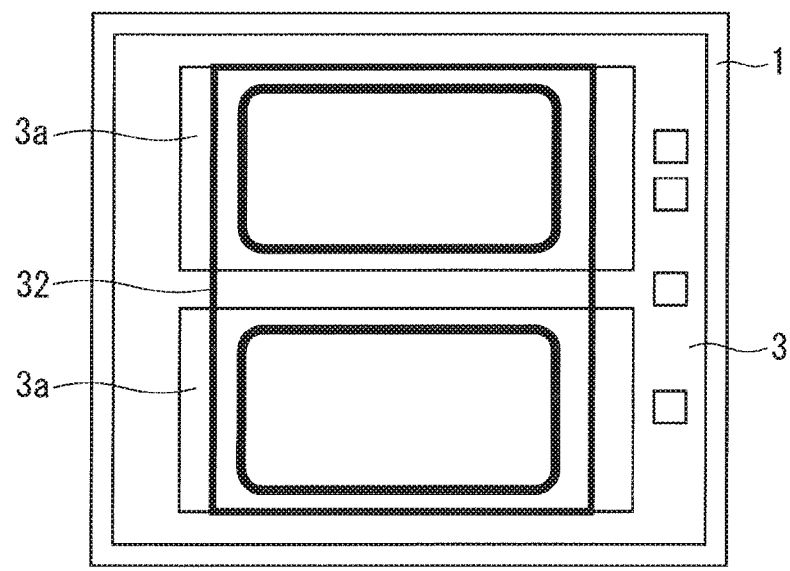
FIG. 11 is another diagram for describing the process step of oxidizing the metal film of the semiconductor device according to the second embodiment.

The following describes a semiconductor device 30A according to a second embodiment. FIG. 8 is a plan view illustrating the semiconductor device 30A according to the second embodiment before joining to the lead frame 6. FIG. 9 is a cross-sectional view of the semiconductor device 30A, and corresponds to FIG. 3. FIG. 10 is a diagram for describing a process step of oxidizing the metal film 4 of the semiconductor device 30A. FIG. 11 is another diagram for describing the process step of oxidizing the metal film 4 of the semiconductor device. Identical components between the first and second embodiments are denoted by the same sings, and will not be elaborated upon.

In the second embodiment, the entire peripheral portion of the metal film 4 is oxidized, as illustrated in FIGS. 8 and 9. In other words, the metal film 4 has an oxidized portion 7 disposed throughout its peripheral portion. The semiconductor device according to the second embodiment, which includes the oxidized portion 7, further regulates a region for the solder to flow than the semiconductor device according to the first embodiment. This improves the assembly performance of the semiconductor device 30A.

The following describes how to form the oxidized portion 7. The anti-oxidation film 5 is formed with the method described in the first embodiment. Subsequently used is a heater 31 having a rectangular shape in plan view for instance, as illustrated in FIG. 10. The heater 31 is moved through the entire peripheral portion of the metal film 4, with the heater 31 brought into contact with the peripheral portion. Accordingly, the contact portion of the metal film 4 undergoes oxidation, thus forming the oxidized portion 7.

The oxidized portion 7 can be also formed through another process, as illustrated in FIG. 11; a heater 32 having a frame shape for instance is used; and the contact portion of the metal film 4 undergoes oxidation while the heater 32 is brought into contact with the entire peripheral portion of the metal film 4 at the same time.

As described above, the semiconductor device 30A according to the second embodiment, which includes the metal film 4 whose entire peripheral portion is oxidized, further regulates the region for the solder to flow than the semiconductor device according to the first embodiment. This further improves the assembly performance of the semiconductor device 30A.

As illustrated in FIG. 10, the method for manufacturing the semiconductor device 30A includes oxidizing the contact portion of the metal film 4 by moving the heater 31 through the entire peripheral portion of the metal film 4, with the heater 31 brought into contact with the peripheral portion. This achieves oxidation with a simple method.

As illustrated in FIG. 11, the method for manufacturing the semiconductor device 30A includes oxidizing the contact portion of the metal film 4 while bringing the heater 32, having a frame shape, into contact with the entire peripheral portion of the metal film 4 at the same time. This method achieves oxidation in an easier and less time-consuming manner than the method illustrated in FIG. 10.

Alternatively, the method may include forming a native oxide film at the peripheral portion of the metal film 4 by leaving the peripheral portion of the metal film 4, which is exposed from the anti-oxidation film 5, in the air at room temperature. This alternative method achieves oxidation in a simpler manner than those in FIGS. 10 and 11.

Third Embodiment

Figure 12:
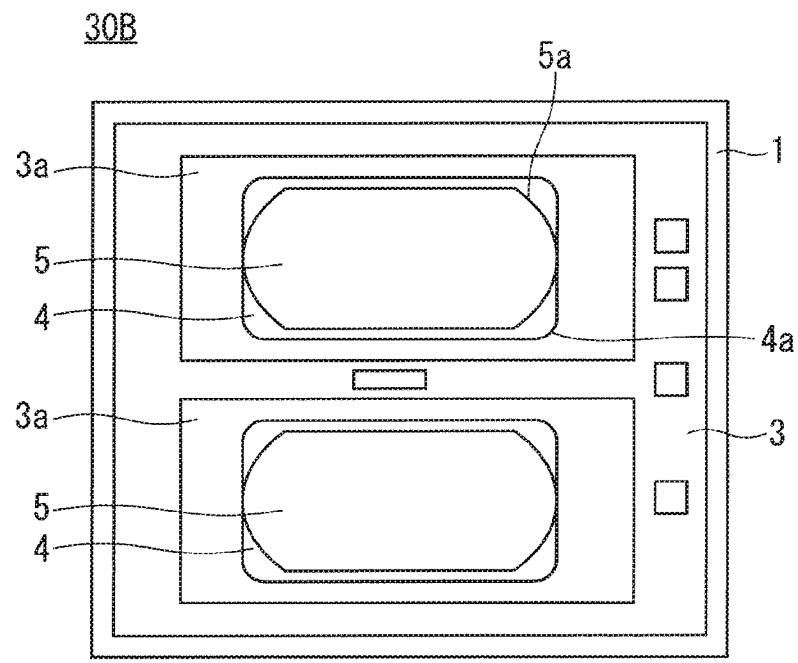
FIG. 12 is a plan view illustrating a semiconductor device according to a third embodiment before joining to the lead frame.

The following describes a semiconductor device 30B according to a third embodiment FIG. 12 is a plan view illustrating the semiconductor device 30B according to the third embodiment before joining to the lead frame 6. Identical components between the third embodiment and the first and second embodiments are denoted by the same sings, and will not be elaborated upon.

As illustrated in FIG. 12, the anti-oxidation film 5 in the third preferred embodiment has a corner portion 5a. The corner portion 5a has a radius R1 larger than a radius R2 of a corner portion 4a of the metal film 4. The corner portion 5a of the anti-oxidation film 5 on the emitter electrode 3a, where the solder 2b is disposed, particularly tends to exhibit stress concentration. The radius R1 of the corner portion 5a of the anti-oxidation film 5 is hence larger than the radius R2 of the corner portion 4a of the metal film 4. This reduces such stress concentration at the corner portion 5a of the anti-oxidation film 5. Here, the anti-oxidation film 5 on the emitter electrode 3a is provided in as broad a range as possible in order to minimize wire resistance.

Figure 13:
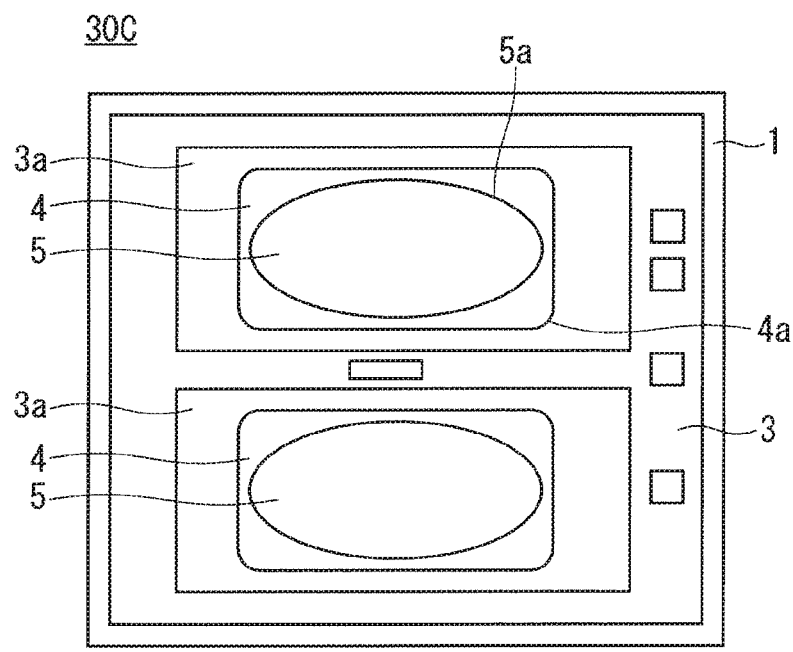
FIG. 13 is a plan view illustrating a semiconductor device according to a modification of the third embodiment before joining to the lead frame.

In this case, the anti-oxidation film 5 may be circular or elliptical in plan view, as illustrated in FIG. 13. FIG. 13 is a plan view illustrating a semiconductor device 30C according to a modification of the third embodiment before joining to the lead frame 6.

As described above, the semiconductor device 30B according to the third preferred embodiment includes the anti-oxidation film 5 having the corner portion 5a whose radius R1 is larger than the radius R2 of the corner portion 4a of the metal film 4. The semiconductor device 30C according to the modification of the third preferred embodiment includes the anti-oxidation film 5 that is circular or elliptical in plan view. These semiconductor devices reduce the stress concentration at the corner portion 5a of the anti-oxidation film 5.

Fourth Embodiment

Figure 14:
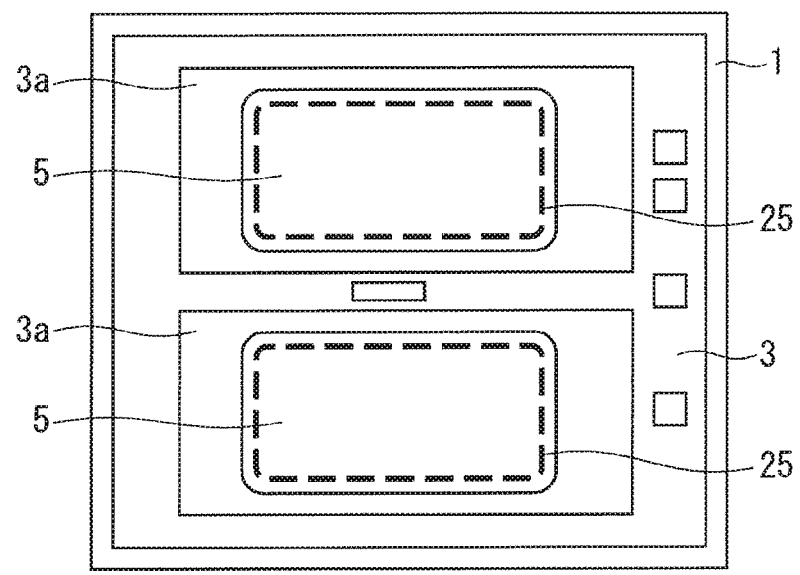
FIG. 14 is a plan view illustrating a semiconductor device according to a fourth embodiment before joining to the lead frame.
Figure 15:
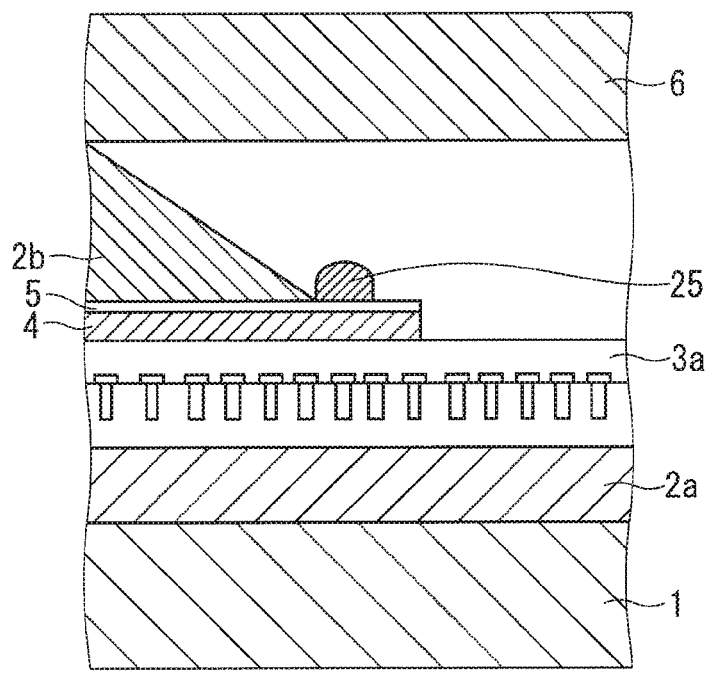
FIG. 15 is a cross-sectional view of the semiconductor device according to the fourth embodiment, and corresponds to FIG. 3.
Figure 16:
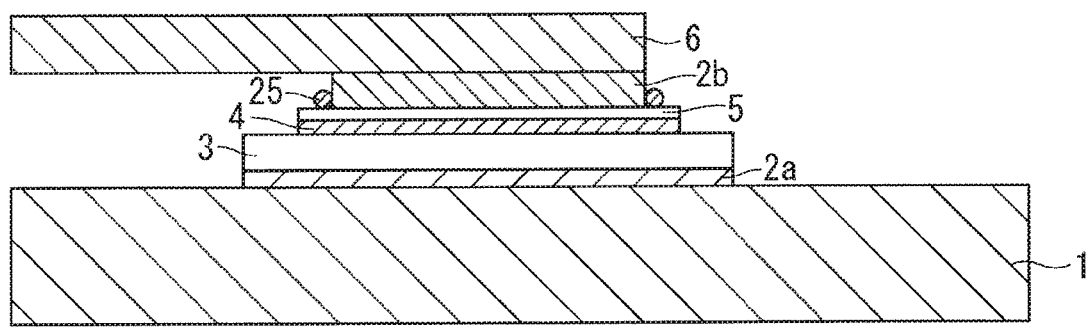
FIG. 16 is a cross-sectional view of the semiconductor device according to the fourth embodiment.

The following describes a semiconductor device 30D according to a fourth embodiment. FIG. 14 is a plan view illustrating the semiconductor device 30D according to the fourth embodiment before joining to the lead frame 6. FIG. 15 is a cross-sectional view of the semiconductor device 30D, and corresponds to FIG. 3. FIG. 16 is a cross-sectional view of the semiconductor device 30D. Identical components between the fourth embodiment and the first to third embodiments are denoted by the same sings, and will not be elaborated upon.

As illustrated in FIGS. 14 to 16, the semiconductor device 30D in the fourth embodiment includes the metal film 4 whose entire peripheral portion remains unexposed from the anti-oxidation film 5. The semiconductor device 30D further includes a metal wire 25 disposed throughout the peripheral portion of the anti-oxidation film 5. The wire 25 is made of the same material as a signal wire for controlling the semiconductor element 3, and is made of, for instance, aluminum. The semiconductor device 30D includes a plurality of short wires 25 spaced from each other at predetermined intervals.

The wire 25 is made of the same material as the signal wire. This allows the wire 25 to be placed at the time of conventional wire bonding and to be placed using the same equipment, thereby eliminating the need for a changeover. It is noted that the wire 25 may be an aluminum wire having a diameter Φ of 50 μm or greater and 500 μm or less, and may undergo bonding in stitch form.

Alternatively, the wire 25 may be a single long wire, and the single long wire 25 may be continuously disposed throughout the peripheral portion of the anti-oxidation film 5.

As described above, the semiconductor device 30D according to the fourth embodiment includes the metal wires 25 disposed throughout the peripheral portion of the anti-oxidation film 5.

The metal wires 25 prevent the solder 2b from flowing and spreading, thereby preventing degradation in the strength of the joint between the emitter electrode 3a and the lead frame 6. As a result, the emitter electrode 3a of the semiconductor element 3 receives a reduced stress at the peripheral portion of the joint portion 3b, which is the joint between the emitter electrode 3a and the lead frame 6.

Doing so prevents cracking in the electrode on the surface; such cracking results from the emitter electrode 3a as buckled or peeled off by deformation in the metal film 4 under stress due to heat cycles.

Doing so also eliminates the need for a process step of forming a coating film, which has been conventionally performed, thereby lowering the possibility that foreign matters can adhere during transfer between process steps. This eliminates the need for inspections, for instance, on the position and dimension of the coating film after formation, and on thin spots in the coating film, thereby reducing process steps.

The wire 25 is made of the same material as the signal wire. This allows the wire 25 to be placed at the time of conventional wire bonding and to be placed using the same equipment, thereby eliminating the need for a changeover.

Fifth Embodiment

Figure 17:
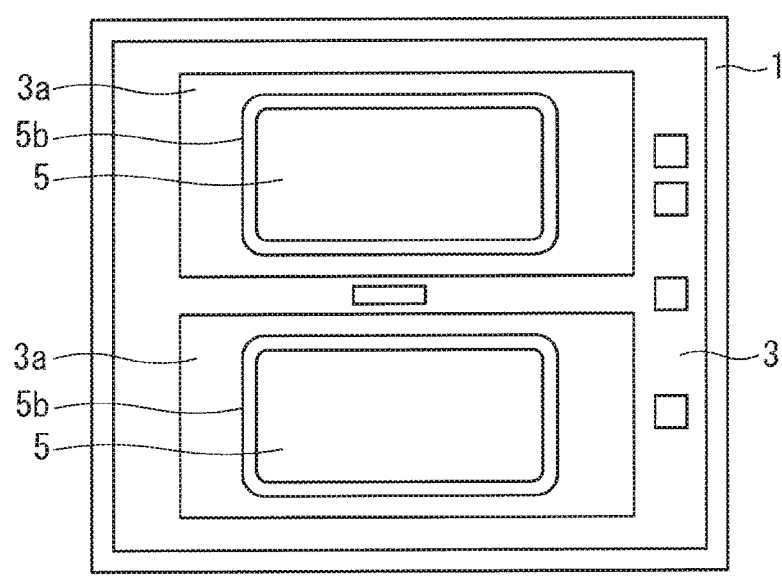
FIG. 17 is a plan view illustrating a semiconductor device according to a fifth embodiment before joining to the lead frame.
Figure 18:
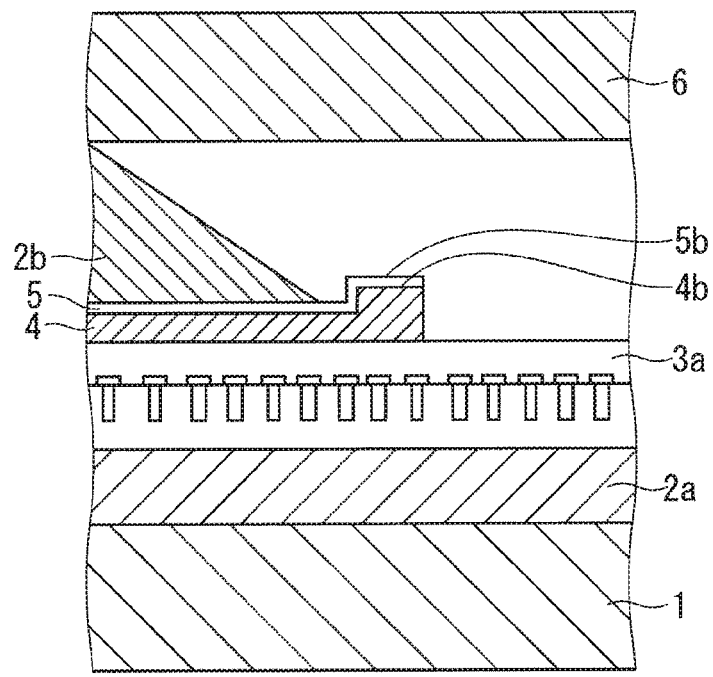
FIG. 18 is a cross-sectional view of the semiconductor device according to the fifth embodiment, and corresponds to FIG. 3.
Figure 19:
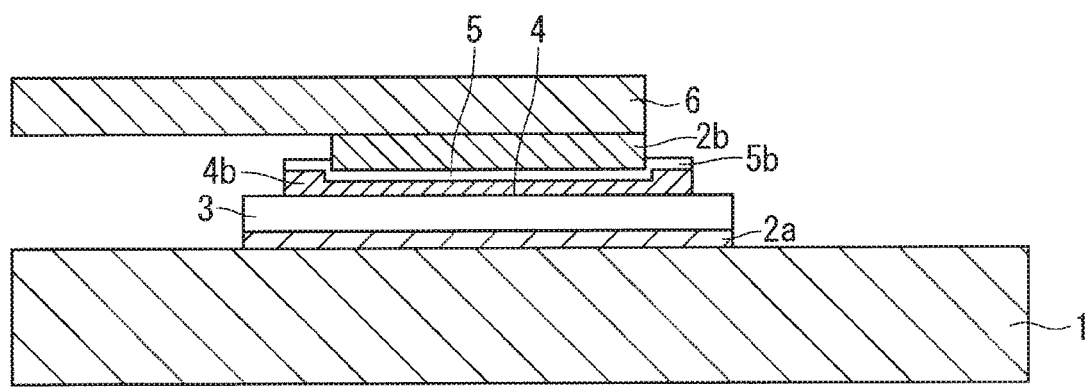
FIG. 19 is a cross-sectional view of the semiconductor device according to the fifth embodiment.

The following describes a semiconductor device 30E according to a fifth embodiment. FIG. 17 is a plan view illustrating the semiconductor device 30E according to the fifth embodiment before joining to the lead frame 6. FIG. 18 is a cross-sectional view of the semiconductor device 30E, and corresponds to FIG. 3. FIG. 19 is a cross-sectional view of the semiconductor device 30E. Identical components between the fifth embodiment and the first to fourth embodiments are denoted by the same sings, and will not be elaborated upon.

As illustrated in FIGS. 17 to 19, the semiconductor device 30E in the fifth embodiment includes the metal film 4 whose entire peripheral portion remains unexposed from the anti-oxidation film 5. The anti-oxidation film 5 has a step portion 5b disposed throughout its peripheral portion, and protruding upward. In addition, the metal film 4 has a step portion 4b disposed throughout its peripheral portion, and protruding upward. Such a configuration regulates a region for the solder to flow, and improves the assembly performance of the semiconductor device 30E.

The following briefly describes how to form the step portion 4b. The step portion 4b can be formed by forming the metal film 4 once, followed by layering the metal film 4 onto only the peripheral portion of the metal film 4, using, for instance, a stainless steel mask having such a size as to cover a region except the peripheral portion of the metal film 4. Alternatively, the step portion 4b can be formed by forming the metal film 4 once, followed by etching a region in which the solder 2b is joined.

As described above, the semiconductor device 30E according to the fifth embodiment includes the anti-oxidation film 5 that has the step portion 5b disposed throughout its peripheral portion, and protruding upward. The semiconductor device 30E also includes the metal film 4 that has the step portion 4b disposed throughout its peripheral portion, and protruding upward.

The step portions 5b and 4b prevent the solder 2b from flowing and spreading, thereby preventing degradation in the strength of the joint between the emitter electrode 3a and the lead frame 6. As a result, the emitter electrode 3a of the semiconductor element 3 receives a reduced stress at the peripheral portion of the joint portion 3b, which is the joint between the emitter electrode 3a and the lead frame 6.

Doing so prevents cracking in the electrode on the surface; such cracking results from the emitter electrode 3a as buckled or peeled off by deformation in the metal film 4 under stress due to heat cycles.

Doing so also eliminates the need for a process step of forming a coating film, which has been conventionally performed, thereby lowering the possibility that foreign matters can adhere during transfer between process steps. This eliminates the need for inspections, for instance, on the position and dimension of the coating film after formation, and on thin spots in the coating film, thereby reducing process steps.

While the invention has been shown and described in detail, the foregoing description is in all aspects illustrative and not restrictive. It is therefore understood that numerous modifications and variations can be devised without departing from the scope of the invention.

It is noted that in the present invention, the individual embodiments can be freely combined, or can be modified and omitted as appropriate, within the scope of the invention.

EXPLANATION OF REFERENCE SIGNS 1 heat spreader, 2b solder, 3 semiconductor element, 3a emitter electrode, 4 metal film, 4a corner portion, 4b step portion, 5 anti-oxidation film, 5a corner portion, 5b step portion, 6 lead frame, 25 wire, 30, 30A, 30B, 30C, 30D, 30E semiconductor device, 31, 32 heater, 40 main conversion circuit, 50 control circuit.

The invention claimed is:

1. A semiconductor device comprising:
a semiconductor element disposed on a heat spreader;
a lead frame joined to an electrode of the semiconductor element via a joining material;
a metal film disposed on a surface of the electrode; and
an anti-oxidation film disposed on a surface of the metal film and interposed between the metal film and the joining material, wherein
the metal film comprises a peripheral portion that is entirely exposed from the anti-oxidation film.

2. The semiconductor device according to claim 1, wherein
the entire peripheral portion of the metal film is oxidized.

3. The semiconductor device according to claim 1, wherein
the anti-oxidation film comprises a corner portion whose radius is larger than a radius of a corner portion of the metal film.

4. The semiconductor device according to claim 3, wherein
the anti-oxidation film is circular or elliptical in plan view.

5. A power converter comprising:
a main conversion circuit comprising the semiconductor device according to claim 1, the main conversion circuit being configured to convert and then output received power; and
a control circuit configured to output a control signal for controlling the main conversion circuit, to the main conversion circuit.

6. A method for manufacturing the semiconductor device according to claim 1, the method comprising:
using a solder plate as the joining material;
placing the solder plate onto a surface of the anti-oxidation film; and
joining the lead frame to the electrode using the solder plate.

7. A method for manufacturing the semiconductor device according to claim 1, the method comprising:
using molten solder as the joining material;
putting the molten solder onto a surface of the anti-oxidation film; and
joining the lead frame to the electrode using the molten solder.

8. A method for manufacturing the semiconductor device according to claim 2, the method comprising
oxidizing a contact portion of the metal film by moving a heater through the entire peripheral portion of the metal film, with the heater brought into contact with the peripheral portion.

9. A method for manufacturing the semiconductor device according to claim 2, the method comprising
oxidizing a contact portion of the metal film while bringing a heater having a frame shape into contact with the entire peripheral portion of the metal film at the same time.

10. A semiconductor device comprising:
a semiconductor element disposed on a heat spreader;
a lead frame joined to an electrode of the semiconductor element via a joining material;
a metal film disposed on a surface of the electrode;
an anti-oxidation film disposed on a surface of the metal film; and
a metal wire disposed throughout a peripheral portion of the anti-oxidation film.

11. A power converter comprising:
a main conversion circuit comprising the semiconductor device according to claim 10, the main conversion circuit being configured to convert and then output received power; and
a control circuit configured to output a control signal for controlling the main conversion circuit, to the main conversion circuit.

12. A semiconductor device comprising:
a semiconductor element disposed on a heat spreader;
a lead frame joined to an electrode of the semiconductor element via a joining material;
a metal film disposed on a surface of the electrode;
an anti-oxidation film disposed on a surface of the metal film; and
step portions disposed throughout peripheral portions of the anti-oxidation film and the metal film, the step portions protruding upward.

13. A power converter comprising:
a main conversion circuit comprising the semiconductor device according to claim 12, the main conversion circuit being configured to convert and then output received power; and a control circuit configured to output a control signal for controlling the main conversion circuit, to the main conversion circuit.

14. A semiconductor device comprising:
a semiconductor element disposed on a heat spreader;
a lead frame joined to an electrode of the semiconductor element via a joining material;
a metal film disposed on a surface of the electrode; and
an anti-oxidation film disposed on a surface of the metal film,
wherein the metal film comprises a peripheral portion that is entirely exposed from the anti-oxidation film, and
the entire peripheral portion of the metal film is oxidized.

15. A semiconductor device comprising:
a semiconductor element disposed on a heat spreader;
a lead frame joined to an electrode of the semiconductor element via a joining material;
a metal film disposed on a surface of the electrode; and
an anti-oxidation film disposed on a surface of the metal film,
wherein the metal film comprises a peripheral portion that is entirely exposed from the anti-oxidation film, and
the anti-oxidation film comprises a corner portion whose radius is larger than a radius of a corner portion of the metal film.

* * * * *